(12) United States Patent
Weber et al.

(10) Patent No.: US 9,974,122 B2
(45) Date of Patent: May 15, 2018

(54) DISPLAYS WITH VIAS

(71) Applicant: Apple Inc., Cupertino, CA (US)

(72) Inventors: Douglas J. Weber, Arcadia, CA (US); Fletcher R. Rothkopf, Los Altos, CA (US); Paul S. Drzaic, Morgan Hill, CA (US); Teodor Dabov, San Francisco, CA (US); Derek W. Wright, San Francisco, CA (US); Scott A. Myers, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 55 days.

(21) Appl. No.: 14/866,624

(22) Filed: Sep. 25, 2015

(65) Prior Publication Data
US 2016/0088692 A1 Mar. 24, 2016

Related U.S. Application Data

(62) Division of application No. 13/766,657, filed on Feb. 13, 2013, now Pat. No. 9,226,347.

(Continued)

(51) Int. Cl.
| H01L 51/50 | (2006.01) |
|---|---|
| H05B 33/02 | (2006.01) |
| H05B 33/06 | (2006.01) |
| H01L 51/52 | (2006.01) |
| H05B 33/10 | (2006.01) |

(Continued)

(52) U.S. Cl.
CPC ......... *H05B 33/06* (2013.01); *H01L 27/3297* (2013.01); *H01L 51/56* (2013.01); *H05B 33/02* (2013.01); *H05B 33/04* (2013.01); *H05B 33/10* (2013.01); *H05B 33/12* (2013.01); *H05K 1/115* (2013.01); *H01L 2227/32* (2013.01); *H01L 2251/56* (2013.01)

(58) Field of Classification Search
CPC ............. H01L 27/3253; H01L 27/3276; H01L 27/3288; H01L 27/3297; H01L 27/3267
See application file for complete search history.

(56) References Cited

U.S. PATENT DOCUMENTS

| 2,933,655 A | 4/1960 | Gradisar et al. |
|---|---|---|
| 4,066,855 A | 1/1978 | Zenk |

(Continued)

FOREIGN PATENT DOCUMENTS

| CN | 1912716 | 2/2007 |
|---|---|---|
| CN | 101106157 | 1/2008 |

(Continued)

*Primary Examiner* — Mariceli Santiago
(74) *Attorney, Agent, or Firm* — Treyz Law Group, P.C.; G. Victor Treyz; Zachary D. Hadd

(57) ABSTRACT

An electronic device may include a display. The display may be an organic light-emitting diode display. The organic light-emitting diode display may have a substrate layer, a layer of organic light-emitting diode structures, and a layer of sealant. Vias may be formed in the substrate layer. The vias may be formed before completion of the display or after completion of the display. The vias may be filled with metal using electroplating or other metal deposition techniques. The vias may be connected to contacts on the rear surface of the display. The vias may be located in active regions of the display or inactive regions of the display. The display may include a top surface emission portion and a bottom surface emission portion.

13 Claims, 12 Drawing Sheets

Related U.S. Application Data

(60) Provisional application No. 61/664,060, filed on Jun. 25, 2012.

(51) Int. Cl.

| | |
|---|---|
| H01L 27/32 | (2006.01) |
| H01L 51/56 | (2006.01) |
| H05B 33/04 | (2006.01) |
| H05B 33/12 | (2006.01) |
| H05K 1/11 | (2006.01) |

(56) References Cited

U.S. PATENT DOCUMENTS

| | | |
|---|---|---|
| 4,085,302 A | 4/1978 | Zenk et al. |
| 4,431,270 A | 2/1984 | Funada |
| 4,487,993 A | 12/1984 | Becker |
| 4,549,174 A | 10/1985 | Funada |
| 5,235,451 A | 8/1993 | Bryan |
| 5,235,457 A | 8/1993 | Lichtman et al. |
| 5,276,382 A | 1/1994 | Stocker et al. |
| 5,436,744 A | 7/1995 | Arledge et al. |
| 5,483,261 A | 1/1996 | Yasutake |
| 5,488,204 A | 1/1996 | Mead et al. |
| 5,493,069 A | 2/1996 | Conti |
| 5,493,096 A | 2/1996 | Koh |
| 5,577,205 A | 11/1996 | Hwang et al. |
| 5,592,199 A | 1/1997 | Kawaguchi |
| 5,670,994 A | 9/1997 | Kawaguchi |
| 5,825,352 A | 10/1998 | Bisset et al. |
| 5,835,079 A | 11/1998 | Shieh |
| 5,844,781 A | 12/1998 | Schlotterer et al. |
| 5,880,411 A | 3/1999 | Gillespie et al. |
| 5,880,705 A | 3/1999 | Onyskevych et al. |
| 6,091,194 A | 7/2000 | Swirbel et al. |
| 6,188,391 B1 | 2/2001 | Seely et al. |
| 6,191,435 B1 | 2/2001 | Inoue |
| 6,201,346 B1 | 3/2001 | Kusaka |
| 6,239,982 B1 | 5/2001 | Bozzer et al. |
| 6,310,610 B1 | 10/2001 | Beaton et al. |
| 6,323,846 B1 | 11/2001 | Westerman et al. |
| 6,421,033 B1 | 7/2002 | Williams et al. |
| 6,498,592 B1 | 12/2002 | Matthies |
| 6,560,117 B2 | 5/2003 | Moon |
| 6,617,177 B1 | 9/2003 | Winer |
| 6,690,387 B2 | 2/2004 | Zimmerman et al. |
| 6,738,263 B2 | 5/2004 | Corisis et al. |
| 6,774,872 B1 | 8/2004 | Kawada et al. |
| 6,801,174 B2 | 10/2004 | Kayama et al. |
| 6,815,835 B2 | 11/2004 | James |
| 6,936,856 B2 * | 8/2005 | Guenther ............ H01L 25/048 257/89 |
| 7,015,894 B2 | 3/2006 | Morohoshi et al. |
| 7,184,064 B2 | 2/2007 | Zimmerman et al. |
| 7,211,738 B2 | 5/2007 | Lee et al. |
| 7,245,500 B2 | 7/2007 | Khan |
| 7,342,354 B2 * | 3/2008 | Utsunomiya ....... H01L 27/1214 313/503 |
| 7,417,867 B1 | 8/2008 | Matsuda et al. |
| 7,663,607 B2 | 2/2010 | Hotelling |
| 7,791,700 B2 | 9/2010 | Bellamy |
| 7,796,397 B2 | 9/2010 | Yamauchi et al. |
| 7,816,721 B2 | 10/2010 | Yamazaki et al. |
| 7,864,136 B2 | 1/2011 | Matthies et al. |
| 7,977,170 B2 | 7/2011 | Tredwell et al. |
| 8,148,259 B2 | 4/2012 | Aria et al. |
| 8,169,588 B2 | 5/2012 | Oikawa et al. |
| 8,194,222 B2 | 6/2012 | Seki et al. |
| 8,222,666 B2 | 7/2012 | Hatano et al. |
| 8,253,914 B2 | 8/2012 | Kajiya et al. |
| 8,258,523 B2 | 9/2012 | Lee et al. |
| 8,269,923 B2 | 9/2012 | Yamagishi et al. |
| 8,362,488 B2 | 1/2013 | Chaug et al. |
| 8,395,722 B2 | 3/2013 | Mathew et al. |
| 8,450,769 B2 | 5/2013 | Hatano et al. |
| 8,456,586 B2 | 6/2013 | Mathew et al. |
| 8,466,852 B2 | 6/2013 | Drzaic et al. |
| 8,599,353 B2 | 12/2013 | Corrigan et al. |
| 8,623,575 B2 | 1/2014 | Chen |
| 8,736,802 B2 | 5/2014 | Kajiya et al. |
| 8,766,314 B2 | 7/2014 | Hatano et al. |
| 8,766,858 B2 | 7/2014 | Li et al. |
| 8,767,141 B2 | 7/2014 | Mathew et al. |
| 8,804,347 B2 | 8/2014 | Martisauskas et al. |
| 9,195,105 B2 | 11/2015 | Kajiya et al. |
| 9,226,347 B2 | 12/2015 | Weber et al. |
| 2001/0015788 A1 | 8/2001 | Mandai et al. |
| 2002/0085158 A1 | 7/2002 | Armagost et al. |
| 2002/0088986 A1 | 7/2002 | Kayama et al. |
| 2003/0011298 A1 | 1/2003 | Palanisamy |
| 2003/0206331 A1 | 11/2003 | Chung et al. |
| 2004/0016568 A1 | 1/2004 | Palanisamy |
| 2004/0245924 A1 | 12/2004 | Ustunomiya et al. |
| 2004/0263947 A1 | 12/2004 | Drzaic et al. |
| 2005/0024339 A1 * | 2/2005 | Yamazaki ............ G06F 1/1616 345/169 |
| 2005/0072597 A1 | 4/2005 | Lee et al. |
| 2005/0110403 A1 * | 5/2005 | Han ................... H01L 27/3267 313/512 |
| 2006/0026521 A1 | 2/2006 | Hotelling et al. |
| 2006/0026536 A1 | 2/2006 | Hotelling et al. |
| 2006/0026852 A1 | 2/2006 | Hotelling et al. |
| 2006/0108588 A1 * | 5/2006 | Osame ................ H01L 27/3267 257/72 |
| 2006/0125995 A1 | 6/2006 | Tai et al. |
| 2006/0197753 A1 | 9/2006 | Hotelling |
| 2006/0231844 A1 | 10/2006 | Carter |
| 2007/0002009 A1 | 1/2007 | Pasch et al. |
| 2007/0019147 A1 | 1/2007 | Ryu |
| 2007/0035679 A1 | 2/2007 | Lee et al. |
| 2007/0063939 A1 | 3/2007 | Bellamy |
| 2007/0080360 A1 | 4/2007 | Mirsky et al. |
| 2007/0148831 A1 | 6/2007 | Nagata et al. |
| 2008/0010876 A1 | 1/2008 | Sung et al. |
| 2008/0024060 A1 | 1/2008 | Jonnalagadda et al. |
| 2008/0035929 A1 | 2/2008 | Chen |
| 2008/0042180 A1 | 2/2008 | Yamazaki et al. |
| 2008/0049408 A1 | 2/2008 | Yamauchi et al. |
| 2008/0143913 A1 | 6/2008 | Lee et al. |
| 2009/0027896 A1 | 1/2009 | Nishimura et al. |
| 2009/0122653 A1 | 5/2009 | Seki et al. |
| 2009/0191670 A1 | 7/2009 | Heitzinger et al. |
| 2009/0278452 A1 | 11/2009 | Kim |
| 2009/0284688 A1 | 11/2009 | Shiraishi et al. |
| 2010/0097551 A1 | 4/2010 | Yamagishi et al. |
| 2010/0148209 A1 | 6/2010 | Hatano et al. |
| 2010/0265225 A1 | 10/2010 | Han et al. |
| 2010/0315570 A1 | 12/2010 | Mathew et al. |
| 2011/0012845 A1 | 1/2011 | Rothkopf et al. |
| 2011/0101314 A1 | 5/2011 | Kim |
| 2011/0109829 A1 | 5/2011 | Mathew et al. |
| 2011/0115693 A1 * | 5/2011 | Kim ................... H01L 27/3267 345/76 |
| 2011/0176199 A1 | 7/2011 | Sakurai et al. |
| 2011/0186345 A1 | 8/2011 | Pakula et al. |
| 2011/0194063 A1 | 8/2011 | Lee et al. |
| 2011/0204403 A1 | 8/2011 | Kim et al. |
| 2011/0292323 A1 | 12/2011 | Corrigan et al. |
| 2011/0317120 A1 | 12/2011 | Kijiya et al. |
| 2012/0009973 A1 | 1/2012 | Demuynck et al. |
| 2012/0218502 A1 | 8/2012 | Seki et al. |
| 2012/0235969 A1 | 9/2012 | Burns et al. |
| 2012/0242592 A1 | 9/2012 | Rothkopf et al. |
| 2012/0273834 A1 | 11/2012 | Hatano et al. |
| 2012/0287386 A1 | 11/2012 | Kijiya et al. |
| 2012/0319304 A1 | 12/2012 | Pressel et al. |
| 2012/0320319 A1 | 12/2012 | Chen |
| 2013/0002685 A1 | 1/2013 | Shenoy et al. |
| 2013/0082984 A1 | 4/2013 | Drzaic et al. |
| 2013/0088671 A1 | 4/2013 | Drzaic et al. |
| 2013/0094126 A1 | 4/2013 | Rappoport et al. |
| 2013/0107476 A1 | 5/2013 | Wright et al. |
| 2013/0228785 A1 | 9/2013 | Hatano et al. |
| 2013/0328051 A1 | 12/2013 | Franklin et al. |

(56) References Cited

U.S. PATENT DOCUMENTS

| | | |
|---|---|---|
| 2013/0342099 A1 | 12/2013 | Weber et al. |
| 2014/0049522 A1 | 2/2014 | Mathew et al. |
| 2014/0063393 A1 | 3/2014 | Zhong et al. |
| 2014/0138733 A1 | 5/2014 | Hatano et al. |
| 2014/0254094 A1 | 9/2014 | Chang et al. |
| 2014/0265822 A1 | 9/2014 | Drzaic et al. |
| 2014/0293210 A1 | 10/2014 | Kijiya et al. |
| 2016/0021746 A1 | 1/2016 | Wright et al. |
| 2016/0079337 A1 | 3/2016 | Mathew et al. |

FOREIGN PATENT DOCUMENTS

| | | | |
|---|---|---|---|
| CN | 101430473 | 5/2009 | |
| CN | 101636689 | 1/2010 | |
| CN | 102187272 | 9/2011 | |
| CN | 102437405 | 5/2012 | |
| EP | 0474508 | 3/1992 | |
| EP | 2138892 | 12/2009 | |
| EP | 2141573 | 6/2010 | |
| EP | 2418537 | 2/2012 | |
| JP | H05142556 | 6/1993 | |
| JP | 10-261854 | 9/1998 | |
| JP | 2000163031 | 6/2000 | |
| JP | 2001-092381 | 4/2001 | |
| JP | 2001215528 | 8/2001 | |
| JP | 2002-040472 | 2/2002 | |
| JP | 200293851 | 3/2002 | |
| JP | 2002116454 | 4/2002 | |
| JP | 2002341785 | 11/2002 | |
| JP | 2002342033 | 11/2002 | |
| JP | 2003058074 | 2/2003 | |
| JP | 2003-255850 | 9/2003 | |
| JP | 2003-337353 | 11/2003 | |
| JP | 3593975 | 11/2004 | |
| JP | 2005-49685 | 2/2005 | |
| JP | 2006092809 A * | 4/2006 | ......... H01L 27/3248 |
| JP | 2007220569 | 8/2007 | |
| JP | 2008-033094 | 2/2008 | |
| JP | 2009098451 | 5/2009 | |
| JP | 2009-244338 | 10/2009 | |
| JP | 2009229754 | 10/2009 | |
| JP | 2010039211 | 2/2010 | |
| JP | 2011042531 | 3/2011 | |
| KR | 10-2005-0093595 | 9/2005 | |
| KR | 10-2010-005021 | 1/2010 | |
| KR | 10-2011-0059629 | 6/2011 | |
| KR | 10-2012-0020088 | 3/2012 | |
| TW | 200521587 | 7/2005 | |
| TW | I247835 | 1/2006 | |
| TW | I297095 B | 5/2008 | |
| TW | 200839356 | 10/2008 | |
| TW | 201001624 | 1/2010 | |
| TW | 201224716 | 6/2012 | |
| WO | 2006106365 | 10/2006 | |
| WO | 2008114404 | 9/2008 | |
| WO | 2009089105 | 7/2009 | |

\* cited by examiner

DISPLAYS WITH VIAS

This application is a division of U.S. patent application Ser. No. 13/766,657, filed Feb. 13, 2013, which claims the benefit of U.S. provisional patent application No. 61/664,060 filed Jun. 25, 2012. This application claims the benefit of and claims priority to U.S. patent application Ser. No. 13/766,657, filed Feb. 13, 2013, and U.S. provisional patent application No. 61/664,060 filed Jun. 25, 2012, which are hereby incorporated by reference herein in their entireties.

BACKGROUND

This relates generally to electronic devices, and more particularly, to display for use in electronic devices.

Electronic devices such as portable computers and other electronic equipment may have displays. Driver circuitry may be used to control operation of the displays. In some displays, such as liquid crystal displays, a layer such as a thin-film transistor layer may have a ledge portion on which a display driver integrated circuit is mounted. The minimum size needed for the ledge is at least partly dictated by the size of the driver integrated circuit. In some device designs, such as designs for compact portable devices, the inclusion of this type of driver ledge may give rise to a border region for a liquid crystal display that is larger than desired. In other displays, driver circuitry may be coupled to the display using a flexible printed circuit cable. The attachment structures needed to accommodate attachment of the flexible printed circuit cable to the display may consume more area than desired, particularly in compact devices and in arrangements where thin display borders are desired.

It would therefore be desirable to provide improved ways to interconnect displays with associated circuitry such as display driver circuitry.

SUMMARY

An electronic device may include thin film active devices such as a display. The display may be an organic light-emitting diode display. The organic light-emitting diode display may, for example, have a substrate layer, a layer of organic light-emitting diode structures, and a layer of sealant.

Vias may be formed in a display substrate layer by laser drilling, etching, or other via hole formation techniques. The vias may be formed before completion of the display or after completion of the display. The vias may be at least partially filled with a conductive material such as metal using electroplating or other metal deposition techniques. The vias may be connected to contacts on the rear surface of the display. Traces on the rear surface of the display may be used to route signals from the vias to desired locations on the rear surface of the display. Components such as flexible printed circuits, integrated circuits, connectors, and other circuitry may be mounted to the contacts on the rear surface of the display. Conductive materials such as solder and conductive adhesive may be used in mounting components to the contacts.

The display may include top surface emission portions (e.g., portions of the display that include light emission structures located at the top surface of the display) and bottom surface emission portions (e.g., having light emission structures at the bottom surface of the display that emit light from the top surface through the substrate). Vias may be formed in regions of the display substrate layer under the top surface emission portions. The vias may be coupled to the bottom surface emission portions through traces formed on the bottom surface of the display substrate layer.

Vias in a display substrate layer may be formed by at least partially melting the display substrate layer and inserting wires, rods, or other conductive structures to form the vias. The display substrate layer may be subsequently cooled and excess via material may be removed.

Further features of the invention, its nature and various advantages will be more apparent from the accompanying drawings and the following detailed description.

DETAILED DESCRIPTION

Figure 1:
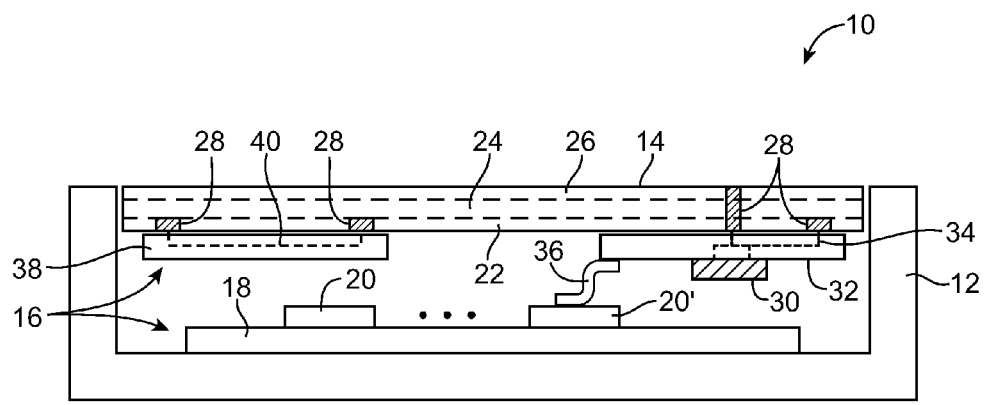
FIG. 1 is a cross-sectional side view of an illustrative electronic device with a display having vias in accordance with an embodiment of the present invention.

Electronic devices may be provided with displays having vias. An illustrative electronic device of the type that may be provided with a display having vias is shown in FIG. 1. Electronic device 10 of FIG. 1 may be a computer, a personal computer, a tablet computer, a cellular telephone, a media player, a gaming device, a navigation device, or other electronic equipment. As shown in the cross-sectional view of device 10 in FIG. 1, electronic device 10 may include housing 12, a display such as display 14, and internal components such as components 16.

Housing 12 may be formed from plastic, metal, fiber-composite materials, glass, ceramic, other materials, or combinations of these materials. Display 14 may be a liquid crystal display, an organic light-emitting diode display, a plasma display, an electrochromic display, an electrophoretic ink display, an electrowetting display, or other suitable display. Examples in which display 14 is implemented as an organic light-emitting diode display are sometimes described herein as an example. This is, however, merely illustrative. Display 14 may be formed using any suitable display if desired. If desired, display 14 may be covered with a cover layer of glass or plastic or other protective display layer. In the example of FIG. 1, a cover layer has been omitted.

Internal components 16 may include printed circuits such as circuits on rigid printed circuit boards (e.g., fiberglass-filled epoxy printed circuit boards), flexible printed circuits ("flex circuits") formed from flexible sheets of polymers such as polyimide, "rigid flex" printed circuits (e.g., printed circuit boards including rigid printed circuit portions with integral flex circuit tails), or other printed circuit structures. As an example, device 10 may include a printed circuit such as printed circuit board 18 on which one or more components such as electrical components 20 or other internal components 16 have been mounted. Components 20 may include switches, connectors, discrete components such as capacitors, resistors, and inductors, integrated circuits such as general purpose processors or application-specific integrated circuits, and other electronic components.

As shown in FIG. 1, display 14 may have multiple layers. Display 14 may be an organic light-emitting diode display including substrate layer 22, a layer of thin-film transistor structures (e.g., polysilicon transistors and/or amorphous silicon transistors) and organic emissive material such as layer 24, and a sealant layer such as layer 26. Substrate layer 22 may be formed from a rigid or flexible dielectric such as glass, ceramic, plastic, or other dielectric materials. As an example, substrate 22 in display 14 may be formed from a flexible sheet of polymer such as a layer of polyimide. If desired, substrate 22 may be formed from transparent materials such as sapphire, glass, plastics, transparent acrylics, or other transparent materials.

Vias such as vias 28 may be formed in display 14. As shown in FIG. 1, for example, vias 28 may be formed through substrate layer 22 so that electrical contacts may be formed on the rear (i.e., inner or bottom) surface of substrate 22 and display 14. Vias 28 may, if desired, be formed through multiple layers of display 14. For example, vias 28 may be formed extending through layer 22 and portions of layer 24. As another example, vias 28 may extend through layers 22, 24, and 26 of display 14.

Vias 28 may be formed by drilling and electroplating or using other via fabrication techniques. For example, via holes may be formed using a laser drill or a mechanical drill. As another example, etching tools may be used to etch via holes in display layers such as substrate layer 22.

Conductive material in vias 28 such as metal may be used to form signal paths in display 14. The signal paths of display 14 may, for example, be used to route signals between the circuitry of layer 24 (e.g., thin-film transistors, organic semiconductor circuitry, oxide transistors, etc.) and external circuitry such as display driver circuitry. Conductive materials used to form vias 28 may include copper, titanium, molybdenum, indium, palladium, rhodium, chromium, gold, silver, platinum, combinations of these materials, or other conductive materials. For example, gold-plated copper may be deposited to cover via holes. Conductive materials such as copper or other heavy metals that are used to form vias 28 may be coated with a protective layer of materials such as titanium, gold, or chromium to help prevent diffusion to neighboring materials (e.g., to protect neighboring materials from being contaminated).

In the example of FIG. 1, display driver integrated circuit 30 may provide control signals such as gate driver signals for circuitry on display 14. Display driver integrated circuit 30 (in the FIG. 1 example) may be mounted on printed circuit 32. Printed circuit 32 may be a rigid printed circuit board, a flex circuit, or a rigid flex circuit. For example, printed circuit 32 may be a flex circuit that includes one or more layers of patterned interconnect lines such as traces 34. Traces 34 may be electrically coupled between one or more vias in substrate layer 22 of display 14 and driver integrated circuit 30. If desired, traces 34 may be coupled to a communications path formed from flex circuit 36 (e.g., a flex circuit that is connected to printed circuit board 18 directly or, as shown in FIG. 1, a flex circuit that is connected to components 20 on printed circuit board 18 via flex circuit connector 20'). The connection between flex circuit 36 and printed circuit 32 may be formed using a connector or by directly attaching (e.g., mounting) flex circuit 36 to traces 34 on printed circuit 32.

Vias 28 may convey control signals from display driver circuit 30 to circuitry such as transistor structures in light-emitting layer 24. By using vias 28 in display layers such as layers 22, 24, and/or 26, the need to form flex circuit attachments or driver circuit attachments to the front (upper/exterior) surface of display 14 may be avoided, allowing the edge regions surrounding the active display pixels in display 14 to be minimized. More area in display 14 may therefore be available for forming the array of pixels that displays images to a user (e.g., for forming an active region of display 14).

If desired, a jumper structure such as structure 38 may be attached to vias on the rear surface of substrate 22 and may be used to route signals between two or more different locations in display 14. Structure 38 may be formed from a printed circuit such as a flex circuit or rigid printed circuit board. Traces 40 in structures 38 may be used to help distribute signals for display 14. Any suitable signals may be routed through flex circuits or other jumper structures on the rear of display 14. For example, structures 38 may be used to carry gate line signals, data line signals, power supply signals, or other information or power signals associated with operating display 14. By implementing at least some of the interconnect resources associated with display 14 using structures located on the rear surface of display 14, more room may be made available on the front surface of display 14 for active pixel structures and the size of any inactive border regions on the front side of display 14 may be minimized.

Structure 38 may, if desired, be formed by depositing conductive materials on the rear of display 14. For example, deposition equipment may be used to deposit conductive materials such as copper, titanium, molybdenum, indium, palladium, rhodium, gold, silver, platinum, or other conductive materials on the rear surface of display 14. The conductive materials may be deposited using deposition techniques such as chemical vapor deposition (CVD), metalorganic chemical vapor deposition (MOCVD), physical vapor deposition (PVD), atomic layer deposition (ALD), or other desired deposition techniques. The conductive materials may be patterned (e.g., using lithography equipment) to form traces for routing display signals.

In the illustrative arrangement of FIG. 1, printed circuit 32 is being used to support display driver integrated circuit 30 and separate flex circuit 36 is being used to convey signals on printed circuit 32 to printed circuit board 18 (via connector 20'). Other arrangements may be used if desired. For example, flex circuit 32 may be mounted directly to traces on printed circuit board 18 (e.g., using anisotropic conductive film or solder connections) or printed circuit 32 may be a flex circuit that is connected directly to connector 20' (e.g., omitting flex circuit 36). Additional flex circuits (not shown) on the real surface of display 14 may be interconnected between vias 28 and circuitry such as circuitry in components 20 on printed circuit board 18. The additional flex circuits may, if desired, include supplemental interconnect lines for forming gate line paths, data line paths, power lines paths, or other signal paths in device 10. Supplemental interconnect lines for forming gate line paths, data line paths, power lines paths, or other signal paths in device 10 may also be formed using jumper structures 38 or by forming traces on the rear of display 14.

Figure 2A:
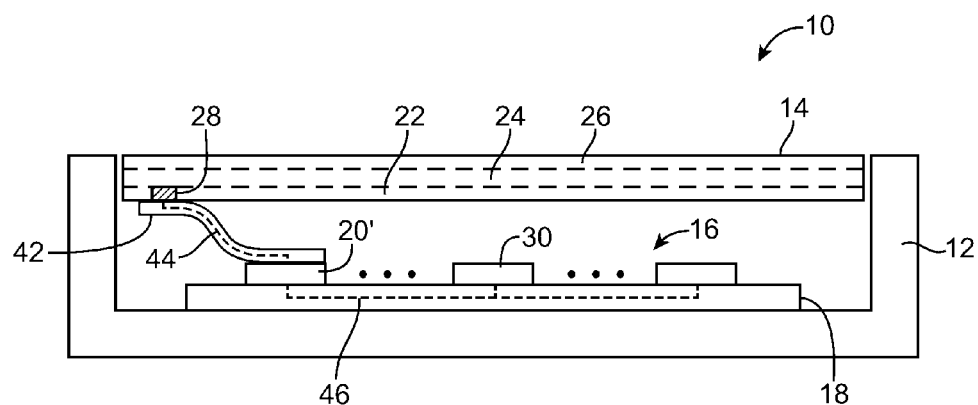
FIG. 2A is a cross-sectional side view of an illustrative electronic device with a display having vias that are coupled to driver circuitry via a flexible printed circuit in accordance with an embodiment of the present invention.

As shown in FIG. 2A, a printed circuit that is mounted to the rear surface of display 14 such as flex circuit 42 may include traces 44 that form signal paths between vias 28 in substrate 22 of display 14 and circuitry on printed circuit board 18. Connector 20' on printed circuit board 18 may be coupled to flex circuit 42 and convey signals from flex circuit 42 to traces 46 on printed circuit board 18. This example is merely illustrative. Flex circuit 42 may, if desired, be directly mounted to printed circuit board 18 using solder, anisotropic conductive film, conductive pastes so that traces 44 are electrically coupled to traces on printed circuit board 18 such as traces 46. Display driver circuitry 30 may be mounted on printed circuit 18 and may convey control and/or data signals to display 14 via traces 46, 44 and vias 28.

Figure 2B:
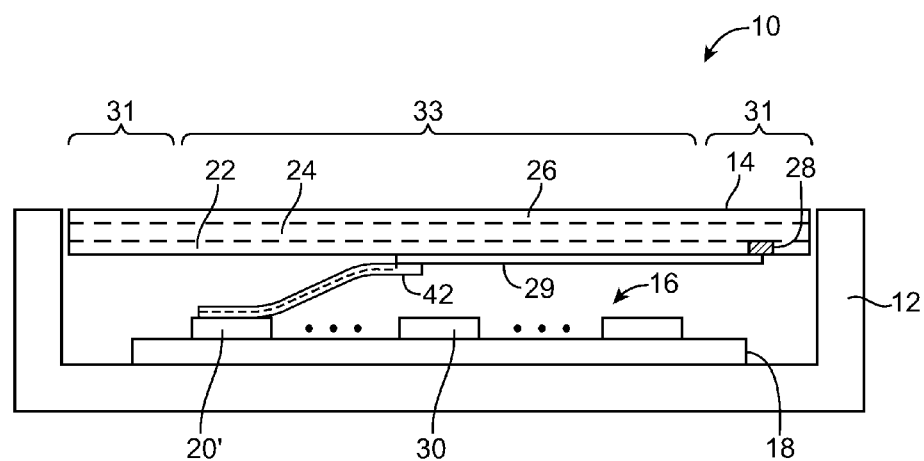
FIG. 2B is a cross-sectional side view of an illustrative electronic device with a display having vias that are coupled to driver circuitry via a flexible printed circuit that is attached to a central portion of the display in accordance with an embodiment of the present invention.

Flex circuit 42 may be mounted underneath a central active region 33 as shown in FIG. 2B. Traces 29 formed on the rear of display 14 may be used to route display signals to a desired location on the rear of display 14. Display 14 may include inactive regions 31 (e.g., regions that do not include active pixels) located at the periphery of active region 33 (e.g., a region with active pixels). In the example of FIG. 2B, traces 29 may be used to convey display signals from vias 28 located in inactive regions 31 to a location beneath active region 33. Flex circuit 42 may be used to convey the display signals between traces 29 and circuitry such as display driver 30 on printed circuit board 18 via connector 20'.

Figure 3:
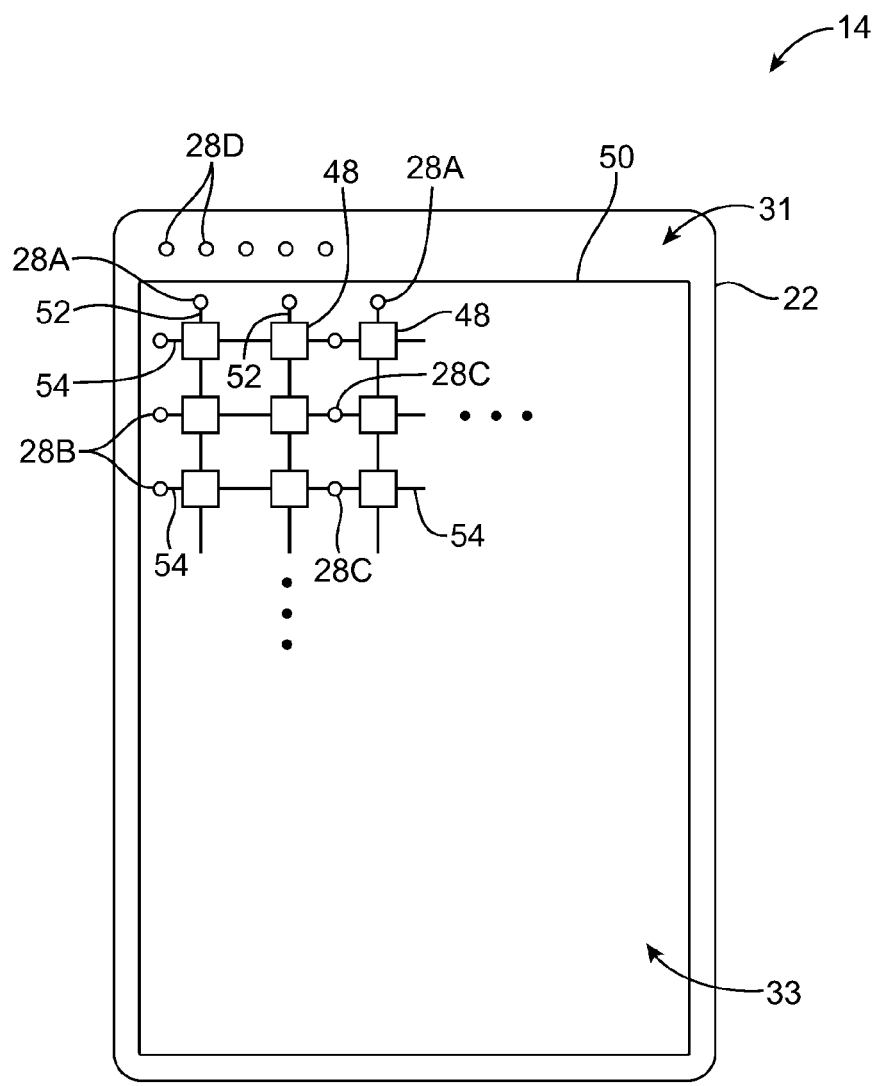
FIG. 3 is a top view of an illustrative display showing how vias may be used in distributing signals for the display in accordance with an embodiment of the present invention.

In some scenarios, it can be challenging to route display signals from circuitry in central active regions to peripheral inactive regions, especially when multiple routing paths are required within a limited amount of available routing space or area. To reduce the number of routing paths required between central regions and peripheral regions of display 14, vias may be formed within the central regions. FIG. 3 is an illustrative diagram of a display 14 including vias 28 (e.g., vias 28A, 28B, and 28C) that are formed within central active region 33.

As shown in FIG. 3, display 14 may include display pixels 48 in active region 33. Display pixels 48 may each contain one or more organic light-emitting diode structures for emitting light. Display pixels 48 may be organized in an array such as array 50. Array 50 may contain any suitable number or rows and columns of display pixels 48. For example, array 50 may have hundreds of rows and/or hundreds of columns of display pixels 48 (as an example). Vertical and horizontal control lines may be used in supplying control signals to display pixels 48. For example, signals may be applied to respective columns of display pixels 48 using vertical signal lines such as lines 52 and may be applied to respective rows of display pixels 48 using horizontal signal lines such as lines 54.

Signal lines 52 and 54 may be coupled to vias 28A and 28B. Vias such as vias 28C may be formed within array 50 (e.g., at intermediate locations in the rows or columns of display pixels 48). Edge vias such as vias 28D that are formed in inactive region 31 may be used for handling signals associated with operating display pixels 48 (e.g., signals for lines 52 and/or 54). Vias 28A, 28B, 28C, and 28D may be formed within substrate layer 22 of display 14 or spanning multiple layers of display 14 (e.g., substrate layer 22, layer 24, and/or layer 26).

Figure 4A:
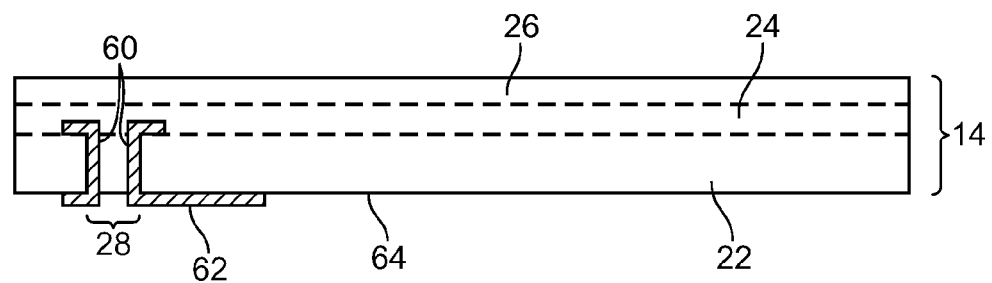
FIG. 4A is a cross-sectional side view of a portion of a display showing how a via may be formed through the rear surface of the display in accordance with an embodiment of the present invention.

A cross-sectional side view of a portion of display 14 containing a via 28 is shown in FIG. 4A. Via 28 may be one of vias 28 of FIGS. 1 and 2, one of vias 28A, 28B, 28C, or 28D of FIG. 3, or other vias formed through substrate 22 of display 14. As shown in FIG. 4A, via 28 may include tubular metal sidewalls such as sidewalls 60 that form a cylindrical inner surface of a through hole in layer 22. Sidewalls 60 may be formed using any desired fabrication technique. For example, sidewalls 60 may be formed using electrodeposition (e.g., formation of a thin seed layer followed by electroplating of a metal such as copper and, if desired, a subsequent coating of a metal such as gold). With a via structure of the type shown in FIG. 4A, via 28 is formed from a hole (e.g., a cylindrical hole) in substrate 22 that is lined with a tubular layer of metal. Other types of vias may be formed in layer 22 if desired (e.g., via holes that are plugged with solid metal, etc.).

If desired, traces may be formed on the surface of substrate 22. As shown in FIG. 4A, for example, contact pad 62 may be formed on rear surface 64 of display 14. Contact 62 may be formed from a metal trace that contacts and is electrically shorted to sidewalls 60 of via 28. Additional patterned conductive structures may be formed on surface 64 of substrate 22 if desired (e.g., conductive structures such as traces 29 of FIG. 2B). The example of FIG. 4A is merely illustrative.

Figure 4B:
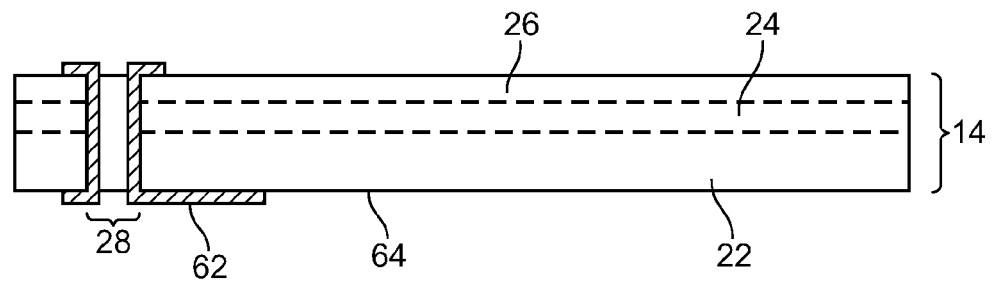
FIG. 4B is a cross-sectional side view of a portion of a display showing how a via may be formed extending through front and rear surfaces of the display in accordance with an embodiment of the present invention.

Vias such as via 28 may be formed to span multiple layers of a display. FIG. 4B is an illustrative cross-sectional side view of a via that spans layers 22, 24, and 26 of display 14. The example of FIG. 4B in which via 28 spans each layer of display 14 is merely illustrative. If desired, via 28 may extend through only one, two, or more layers of display 14. For example, via 28 may be formed to span layers 22 and 24 without spanning sealant layer 26.

Figure 5:
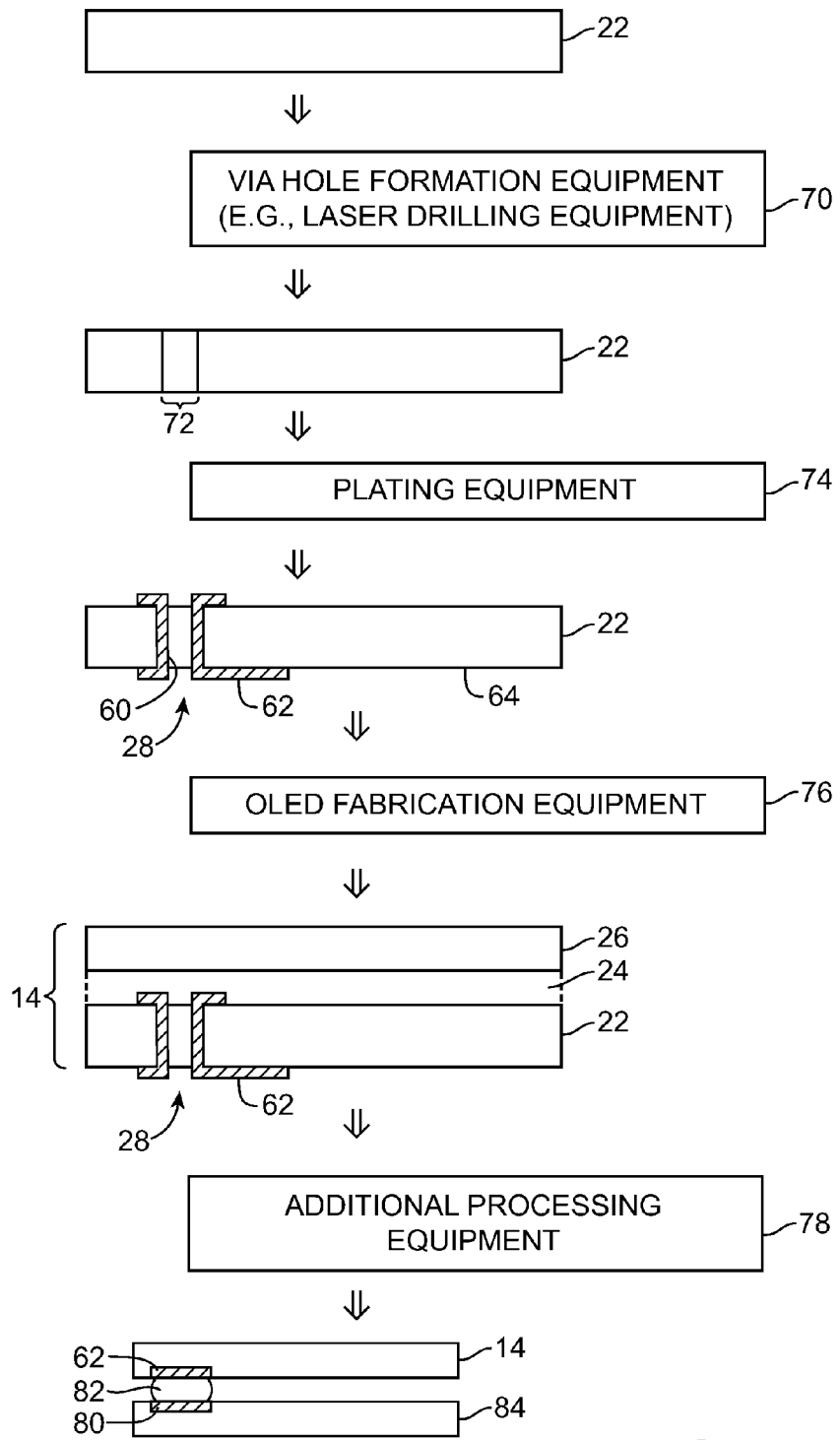
FIG. 5 is a diagram showing how a display may be provided with vias so that circuitry can be attached to the rear of the display in accordance with an embodiment of the present invention.

FIG. 5 is a diagram showing how a display may be provided with vias. Initially, a display substrate 22 may be provided. Substrate 22 may be a layer of polymer such as a layer of polyimide (as an example).

Via hole formation equipment 70 such as laser drilling equipment, mechanical drilling equipment, etching equipment (e.g., chemical or physical etching equipment), field ionization beam equipment, or other via hole formation equipment may be used to form one or more via holes such as via hole 72 in substrate 22.

Following formation of via holes such as via hole 72, conductive material deposition equipment such as metal plating equipment 74 may be used to form conductive structures for vias 28 such as conductive sidewalls 60. Traces such as contact trace 62 may also be formed on lower surface 64 of substrate 22. If desired, traces such as trace 29 of FIG. 2B may be formed on lower surface 64 of substrate 22.

Organic light-emitting diode (OLED) fabrication equipment 76 or other display fabrication equipment may be used to complete display 14. For example, OLED fabrication equipment 76 may be used to form thin-film transistor structures and interconnects in layer 24. Layer 24 may include organic emissive material and light-emitting diode structures that are used to form display pixels such as display pixels 48 of FIG. 3. A sealant layer such as sealant layer 26 (e.g., a polymer layer) may then be deposited over the front (upper) surface of display 14 to protect the structures of layer 24 (e.g., to help protect organic light-emitting material of layer 24 from moisture damage).

Additional processing equipment 78 may then be used to form electrical connections to additional circuitry 84. As shown in FIG. 5, conductive material 82 may be used in forming electrical connections between contacts such as contact 62 on display 14 (e.g., contacts on surface 64 of substrate 22) and associated contacts such as contact 80 on additional circuitry 84. Conductive material 82 may be solder, metal associated with a weld, part of a connector, conductive adhesive (e.g., anisotropic conductive film), or other suitable material for forming an electrical connection between via 28 and additional circuitry 84. Additional circuitry 84 may be a printed circuit or other circuitry. For example, additional circuitry 84 may be a flex circuit on which integrated circuits and/or other electrical components are mounted, a flex circuit cable that is attached to a printed circuit board with components, a rigid printed circuit board, or other suitable circuitry (see, e.g., the illustrative arrangements of FIGS. 1, 2, and 3).

Figure 6A:
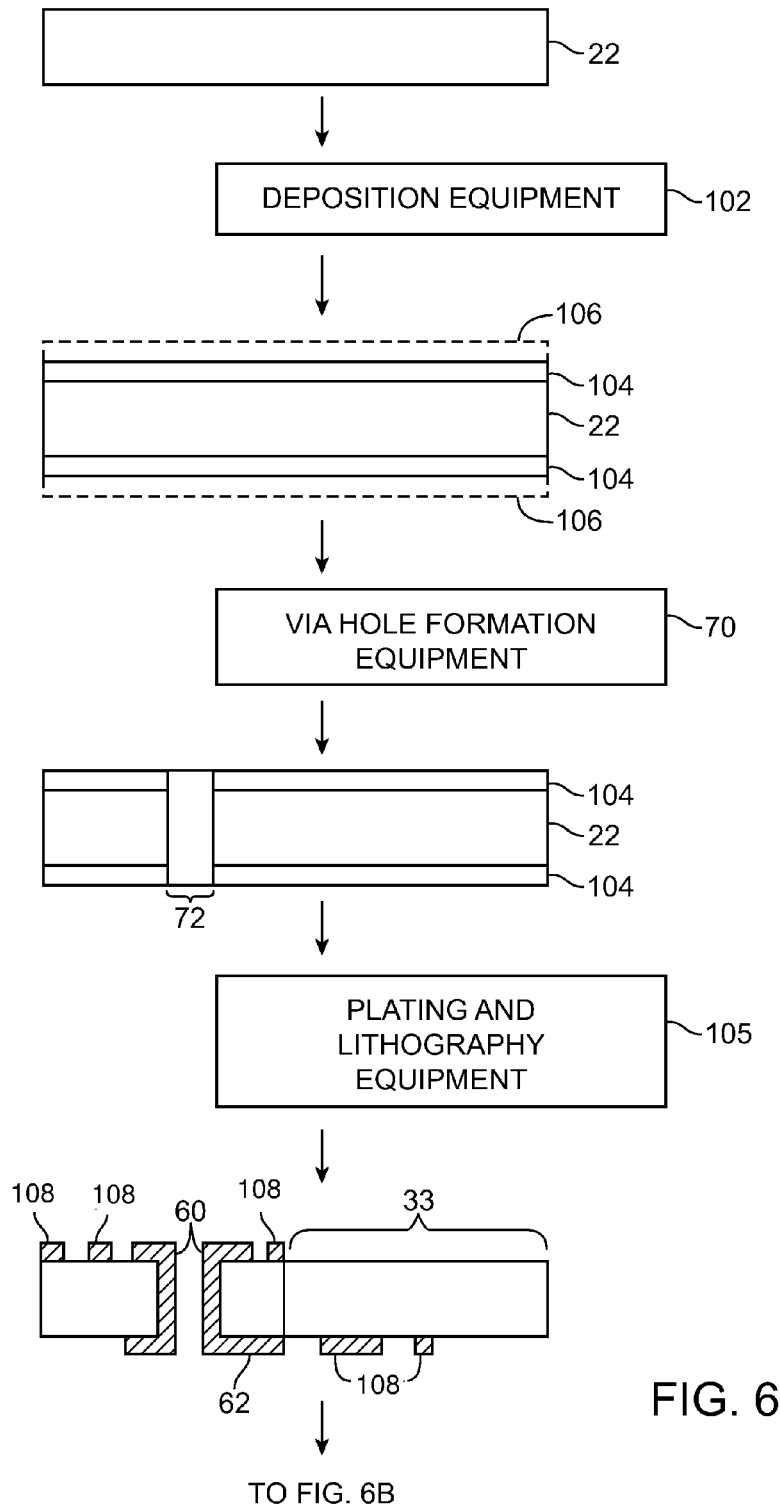
FIGS. 6A-6B are diagrams showing how a display may be provided with vias and traces in accordance with an embodiment of the present invention.
Figure 6B:
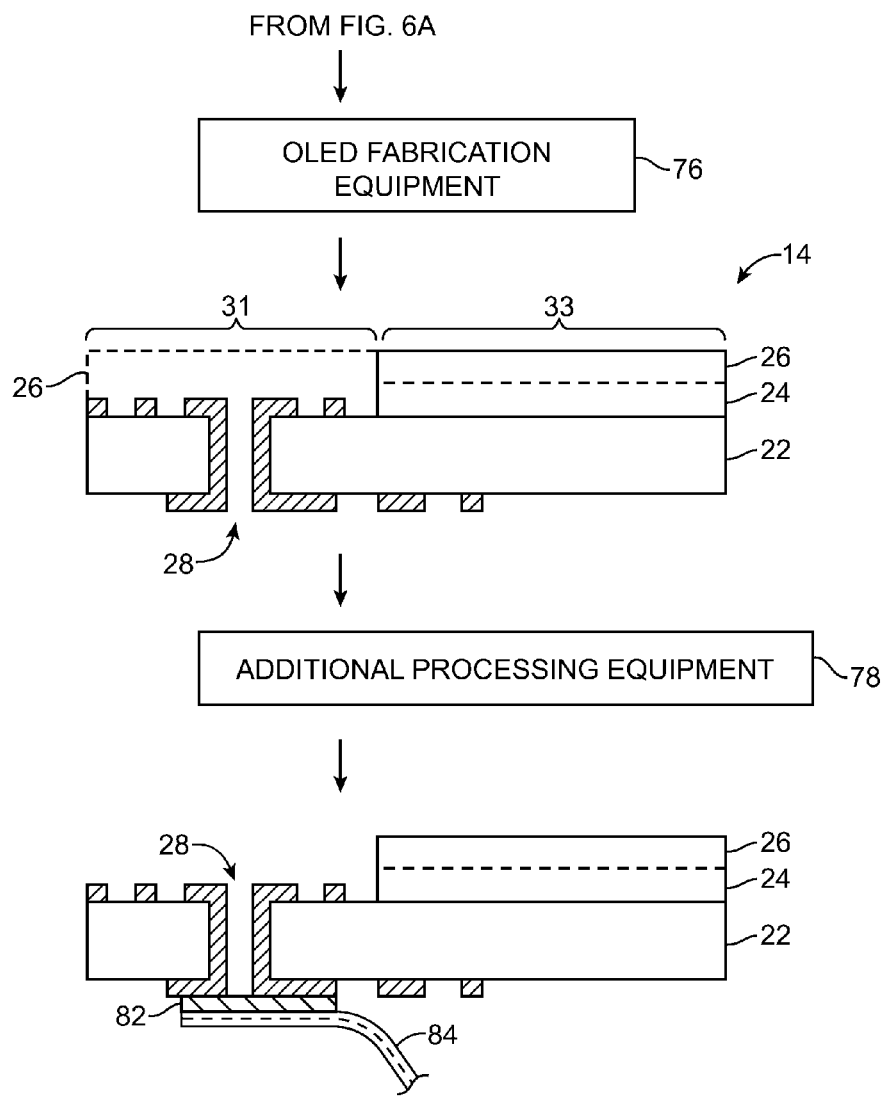

FIGS. 6A and 6B are diagrams showing how vias and interconnection resources may be formed in an inactive region of a display. Initially, a display substrate such as substrate 22 may be provided.

Deposition equipment 102 may be used to deposit conductive layers 104 on the front and rear surfaces of substrate 22. Conductive layers 104 may be formed from any desired conductive material such as copper, titanium, molybdenum, indium, palladium, rhodium, gold, silver, platinum, or other conductive materials. If desired, optional protective layers 106 may be deposited over conductive layers 104 using deposition equipment 102. For example, it may be desirable to coat conductive layers 104 that are formed from copper or other heavy metals with protective layers 106, because copper and other heavy metals can potentially diffuse into and contaminate other materials such as silicon. Protective layers 106 may be formed from conductive or non-conductive materials. For example, protective layers 106 may be formed from a conductive titanium layer that helps block diffusion of the materials of conductive layers 104 into neighboring materials. As another example, protective layers 106 may be formed similar to sealant layer 26 of FIG. 5.

In a subsequent step, via hole formation equipment 70 may be used to form opening 72 in substrate 22 and conductive layers 104 (and, if desired, any associated protective layers 106). Plating and lithography equipment 105 may then be used to form conductive structures for vias 28 (e.g., conductive sidewalls 60 and contacts 62) and traces such as traces 108. Lithography equipment 105 may be used to selectively remove portions of conductive layers 104 to form traces 108 and contacts 62. Traces 108 may be used to convey display signals for the display. Lithography equipment 105 may also be used to remove conductive materials that cover region 33 of substrate 22 (e.g., so that region 33 of substrate 22 is exposed). Region 33 may serve as an active display region.

Organic light-emitting diode fabrication equipment 76 may be subsequently used to complete active region 33 by forming layers 24 and 26. For example, OLED fabrication equipment 76 may be used to form thin-film transistor structures and organic emissive material and light-emitting diode structures in layer 24 and subsequently deposit a sealant layer that covers active region 26. If desired, sealant layer 26 may be deposited to extend over part or all of inactive region 31 (e.g., regions that do not include active pixels). Additional processing equipment 78 may then be used to form electrical connections to additional circuitry 84 using conductive material 82 (e.g., similar to FIG. 5).

Figure 7:
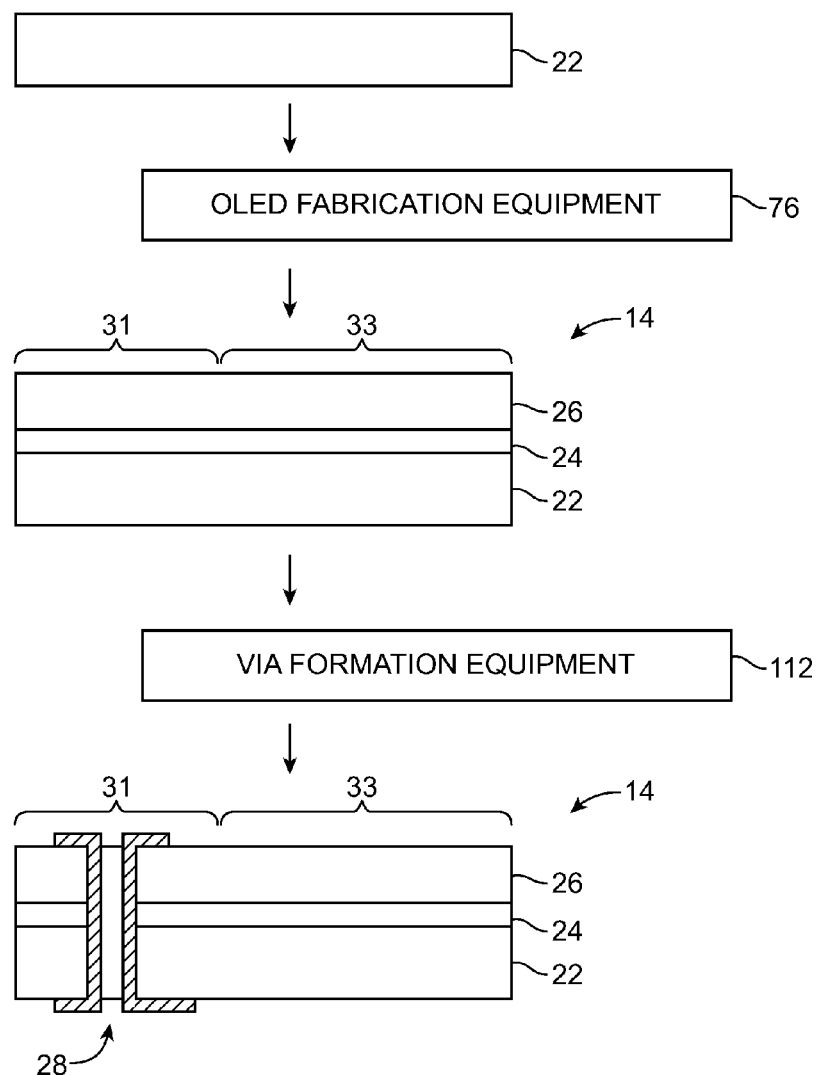
FIG. 7 is a diagram showing how a via may be formed through multiple layers of a display in accordance with an embodiment of the present invention.

The examples of FIGS. 5, 6A, and 6B in which vias 28 are formed before completing display 14 are merely illustrative. FIG. 7 is an illustrative diagram in which via 28 may be formed after completion of display 14.

In the example of FIG. 7, a substrate 22 may be initially provided. Organic light-emission diode fabrication equipment may be used to complete display 14 by forming thin-film transistor structures and light-emitting diode structures in layer 24 and covering layer 24 with sealant layer 26. Completed display 14 may include active region 33 (e.g., a region including active pixels) and inactive region 31 (e.g., a region without any active pixels). Inactive region 31 may be formed along the periphery of active region 33. Via 28 may be subsequently formed using via formation equipment 112. Via formation equipment 112 may, for example, include via hole formation equipment 70 and plating equipment 74 of FIG. 5.

Via 28 of FIG. 7 may be formed extending through layers 24 and 26 of display 14. Via 28 may be electrically coupled to transistor structures or traces in layer 24 and may be used to convey display signals to transistor structures and light-emitting diode structures of layer 24 (e.g., from a driver circuit).

Figure 8:
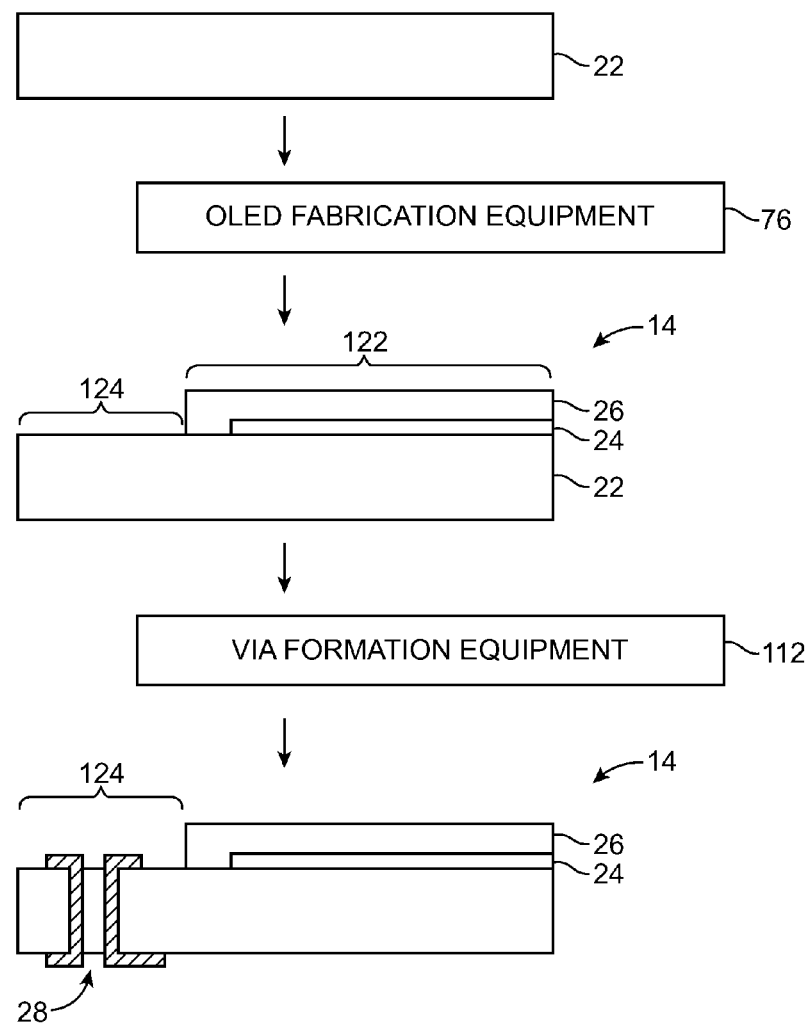
FIG. 8 is a diagram showing how a via may be formed through an exposed portion of a display substrate in accordance with an embodiment of the present invention.

As shown in FIG. 8, organic light-emission diode fabrication equipment 76 may be used to complete display 14 by forming layers 24 and 26 over a region 122 of substrate 22 while leaving an exposed portion of substrate 22 for via formation. Region 122 of substrate 22 may correspond to an active region of display 14 on which layers 24 and 26 are formed. Protective layer 26 may extend somewhat beyond the edge of light-emitting layer 24. Region 124 of substrate 22 be an inactive region of display 14 and may remain exposed after completion of display 14. Via 28 may be subsequently formed in exposed region 124 of substrate 22 using via formation equipment 112.

Figure 9:
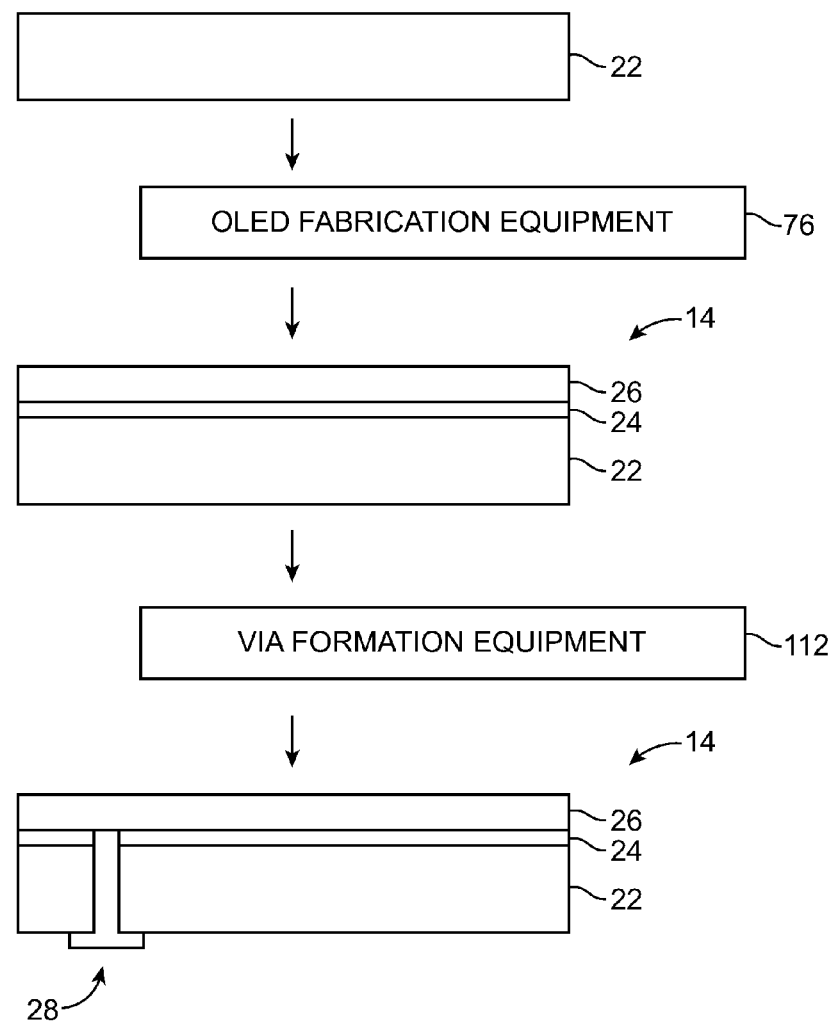
FIG. 9 is a diagram showing how a blind via may be formed in a display in accordance with an embodiment of the present invention.

As shown in FIG. 9, vias such as via 28 may be formed through only a portion of the layers of display 14. Via 28 of FIG. 9 may sometimes be referred to as a blind via, because via 28 is exposed only on a single (e.g., rear) surface of display 14. After completion of display 14 using organic light-emitting diode fabrication equipment 76 to form layers 24 and 26 over substrate 22, via formation equipment 112 may be used to form via 28 extending only through layers 22 and 24. For example, via formation equipment 112 may include via hole formation equipment that can be used to drill a via hole from the rear surface of substrate 22 to extend through substrate 22 and layer 24. As another example, etching equipment may be used to etch a via hole through layers 22 and 24. In this scenario, the etching process may be timed based on a desired depth for the via hole. If desired, the via hole may extend through a portion of sealant layer 26. Conductive via structures may be subsequently formed in the via hole (e.g., via formation equipment 112 may be used to perform electroplating or other fabrication techniques).

If desired, display 14 may be provided with portions (regions) in which light is emitted through substrate 22 (sometimes referred to as bottom surface emission portions or bottom emission portions) and portions in which light is directly emitted by a light emission layer without passing through substrate 22 (sometimes referred to as top surface emission portions or top emission portions). In other words, bottom surface emission portions include light-emitting structures located at the bottom surface of display 14 that emit light through the top surface of display 14, whereas top surface emission portions include light-emitting structures located at the top surface of display 14 that emit light directly through the top surface.

Figure 10:
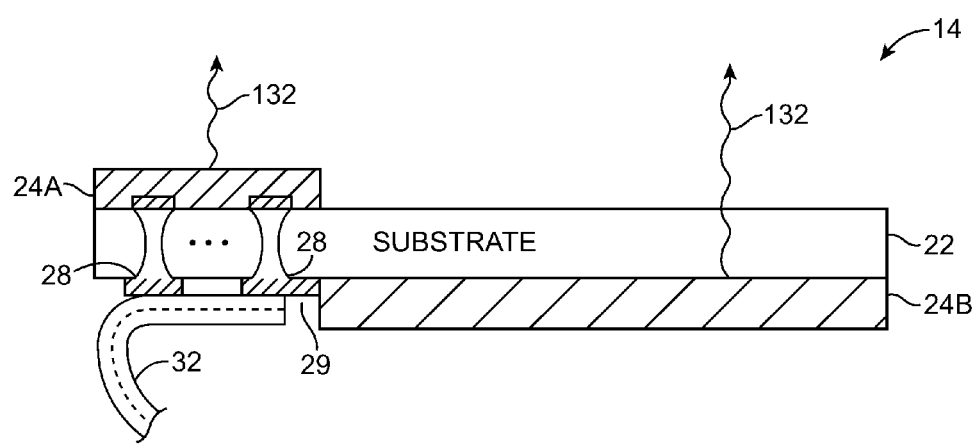
FIG. 10 is an illustrative display having top and bottom emission regions in accordance with an embodiment of the present invention.

FIG. 10 is an illustrative arrangement in which display 14 is provided with a top surface emission portion 24A and a bottom surface emission portion 24B. Top surface emission portion 24A and bottom surface emission portion 24B may each include organic emissive materials and organic light-emitting diode structures and thin film transistor structures. Top surface emission portion 24A may directly produce light 132 that does not pass through substrate 22, whereas bottom surface emission portion 24B may produce light 132 that passes through substrate 22. In the example of FIG. 10, substrate 22 may be formed from transparent materials such as glass, plastics (e.g., polymers such as polyimide), sapphire, transparent acrylics, or other transparent substrate materials.

Vias 28 may be formed on the rear surface of substrate 22 underneath top surface emission portion 24A. Vias 28 may be electrically connected to top surface emission region 24A, bottom surface emission region 24B, and printed circuit 32 (e.g., vias 28 may be used to convey display signals between top surface emission region 24A, bottom surface emission region 24B, and printed circuit 32). Vias 28 may be coupled to bottom surface emission region 24B via traces 29 formed on the rear surface of substrate 22.

Figure 11:
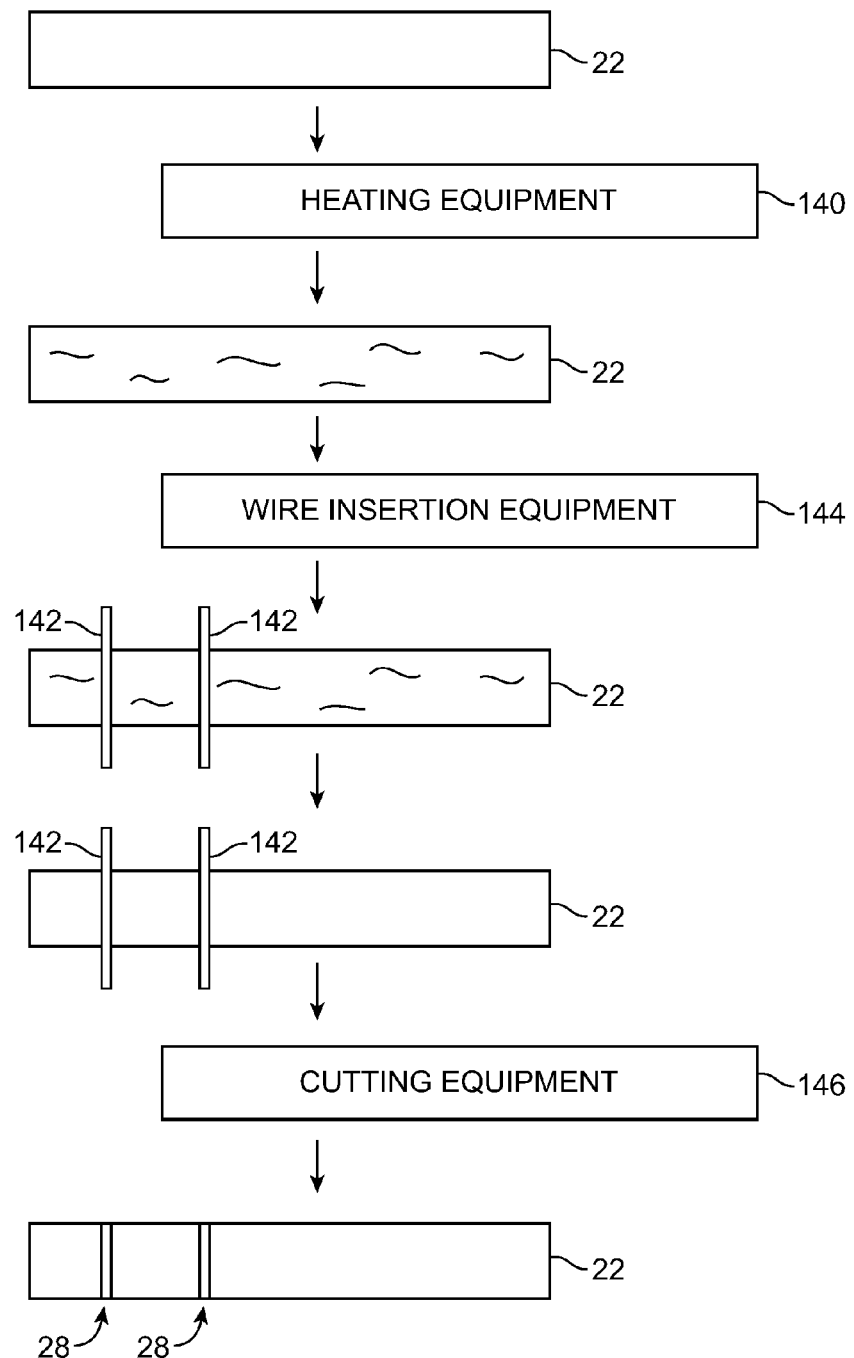
FIG. 11 is a diagram showing how vias may be formed in a display by partially melting a display substrate in accordance with an embodiment of the present invention.

If desired, display vias may be formed as conductive rods that are inserted through a display substrate. FIG. 11 is an illustrative diagram showing how vias 28 may be formed from conductive rods such as wires. An initially provided substrate 22 may be heated using heating equipment 140. Heating equipment 140 may include oil-based heating tools, gas-based heating tools, electrical-based heating tools, or any other heating tools suitable for heating the materials of substrate 22. Heating equipment 140 may, if desired, also include equipment used to apply pressure to substrate 22. Substrate 22 may be heated so that the materials of substrate 22 are partially melted (e.g., partially or completely liquefied). Support structures (not shown) may be used to maintain a desired structure of display 14 during a partially-melted state.

Wire insertion equipment 144 may be used to insert wires 142 or other conductive structures such as conductive rods into melted substrate 22. Wires 142 may be formed from any desired conductive materials. As substrate 22 cools, the materials of substrate 22 may solidify around wires 142. If desired, substrate 22 may be cooled using cooling equipment (not shown). Excess portions of wires 142 may then be removed using cutting equipment 146 to form vias 28. OLED fabrication equipment such as equipment 76 of FIG. 5 may be subsequently used to form display layers such as light-emitting display layer 24 and sealant layer 26.

The foregoing is merely illustrative of the principles of this invention and various modifications can be made by those skilled in the art without departing from the scope and spirit of the invention.

What is claimed is:

1. An electronic device display, comprising:
   a transparent display substrate having front and rear surfaces;
   a front surface emission region on the front surface of the transparent display substrate that emits light from the front surface, wherein the front surface emission region comprises a first light-emitting layer, and wherein the front surface emission region comprises organic light-emitting diodes and thin-film transistors formed on the front surface of the transparent display substrate;
   a rear surface emission region on the rear surface of the transparent display substrate that emits light through the transparent display substrate, wherein the rear surface emission region comprises a second light-emitting layer, and wherein the rear surface emission region comprises organic light-emitting diodes and thin-film transistors formed on the rear surface of the transparent display substrate; and
   a flexible printed circuit that transmits display signals to the first and second light-emitting layers.

2. The electronic device display defined in claim 1 further comprising:
   a via formed in the transparent display substrate that extends from the front surface emission region to the rear surface of the transparent display substrate.

3. The electronic device display defined in claim 2, wherein the flexible printed circuit is coupled to the via at the rear surface of the transparent display substrate, the electronic device display further comprising:
   driver circuitry, wherein the flexible printed circuit conveys a display signal between the driver circuitry and the via.

4. The electronic device display defined in claim 1 further comprising:
   a via that extends through the transparent display substrate, wherein the first light-emitting layer overlaps the via.

5. The electronic device display defined in claim 1 further comprising:
   a conductive via that extends through the display substrate and that transmits the display signals from the flexible printed circuit to the first light-emitting layer; and
   a conductive trace on the rear surface of the transparent display substrate that transmits the display signals from the flexible printed circuit to the second light-emitting layer.

6. The electronic device display defined in claim 5 further comprising:
   display driver circuitry, wherein the flexible printed circuit transmits the display signals from the display driver circuitry to the conductive via and the conductive trace.

7. An electronic device display, comprising:
   a transparent display substrate having front and rear surfaces;
   a front surface emission region on the front surface of the transparent display substrate that emits light from the front surface;
   a rear surface emission region on the rear surface of the transparent display substrate that emits light through the transparent display substrate;

a conductive trace on the rear surface of the transparent display substrate, the conductive trace coupled to the rear surface emission region;

a via formed in the transparent display substrate that extends from the front surface emission region to the rear surface of the transparent display substrate;

a flexible printed circuit board comprising a polymer substrate and electrical traces, wherein the flexible printed circuit board is coupled to the via at the rear surface of the transparent display substrate; and driver circuitry, wherein the flexible printed circuit board conveys a display signal between the driver circuitry and the via.

8. The electronic device display defined in claim 7, wherein the flexible printed circuit board conveys an additional display signal between the driver circuitry and the rear surface emission region through the conductive trace.

9. The electronic device display defined in claim 7 wherein the front surface emission region and the rear surface emission region each comprise organic light-emitting diode structures and thin film transistor structures.

10. The electronic device display defined in claim 7, further comprising:

an additional via formed in the transparent display substrate that extends from the front surface emission region to the rear surface of the transparent display substrate, wherein the via and the additional via are coupled to the front surface emission region.

11. The electronic device display defined in claim 7, wherein the driver circuitry comprises a display driver integrated circuit.

12. An electronic device display, comprising:

a transparent display substrate having front and rear surfaces;

a front surface emission region on the front surface of the transparent display substrate that emits light from the front surface; and a rear surface emission region on the rear surface of the transparent display substrate that emits light through the transparent display substrate, wherein the front surface emission region comprises a first light-emitting layer and wherein the rear surface emission region comprises a second light-emitting layer;

a flexible printed circuit that transmits display signals to the first and second light-emitting layers;

a conductive via that extends through the display substrate and that transmits the display signals from the flexible printed circuit to the first light-emitting layer; and a conductive trace on the rear surface of the transparent display substrate that transmits the display signals from the flexible printed circuit to the second light-emitting layer.

13. The electronic device display defined in claim 12 further comprising:

display driver circuitry, wherein the flexible printed circuit transmits the display signals from the display driver circuitry to the conductive via and the conductive trace.

* * * * *